(12) United States Patent
Sawai et al.

(10) Patent No.: US 8,581,487 B2
(45) Date of Patent: Nov. 12, 2013

(54) LIGHT-EMITTING DEVICE WITH REFLECTION LAYERS

(75) Inventors: Takashi Sawai, Higashiomi (JP); Emi Mukai, Higashiomi (JP); Kousuke Katabe, Higashiomi (JP); Akira Miyake, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 13/503,604

(22) PCT Filed: Nov. 25, 2010

(86) PCT No.: PCT/JP2010/071017
§ 371 (c)(1),
(2), (4) Date: Apr. 23, 2012

(87) PCT Pub. No.: WO2011/065421
PCT Pub. Date: Jun. 3, 2011

(65) Prior Publication Data
US 2012/0212124 A1 Aug. 23, 2012

(30) Foreign Application Priority Data
Nov. 27, 2009 (JP) ................ 2009-270013

(51) Int. Cl.
*H05B 33/22* (2006.01)
(52) U.S. Cl.
USPC ........... 313/498; 313/504; 313/506; 313/499; 445/23; 445/46
(58) Field of Classification Search
CPC ... H01L 51/5271; G02B 5/201; G02B 6/0028

USPC ........ 257/98–99, 40; 313/504–506, 498–499; 445/23–24; 362/97.1
See application file for complete search history.

(56) References Cited

U.S. PATENT DOCUMENTS

2004/0188700 A1 9/2004 Fukasawa et al.
2009/0141492 A1 6/2009 Fujino et al.

FOREIGN PATENT DOCUMENTS

| JP | S59-176166 U | 11/1984 |
|----|--------------|---------|
| JP | 2001-036150 A | 2/2001 |
| JP | 2006-012884 A | 1/2006 |
| JP | 2007-201171 A | 8/2007 |
| JP | 2009-260078 A | 11/2009 |

OTHER PUBLICATIONS

Translation of search report for pct jp2010-071017.pdf.*
International Search Report dated Dec. 28, 2010, issued for International Application No. PCT/JP2010/071017.

* cited by examiner

*Primary Examiner* — Tracie Y Green
(74) *Attorney, Agent, or Firm* — Procopio, Cory, Hargreaves & Savitch LLP (57) ABSTRACT

A light-emitting device includes a substrate, a pair of electrode layers disposed on the substrate, a light-emitting element disposed between the pair of electrode layers to keep a first space with each of the pair of electrode layers while electrically connecting with each of the pair of electrode layers, and a pair of reflection layers, each extending in overlapping relation from one to the other one of the pair of electrode layers as seen in a transparent plan view. The light-emitting element is disposed between the pair of reflection layers to keep a second space with each of the pair of reflection layers.

4 Claims, 11 Drawing Sheets

LIGHT-EMITTING DEVICE WITH REFLECTION LAYERS

TECHNICAL FIELD

The present invention relates to a light-emitting device including a light-emitting element.

BACKGROUND ART

In recent years, developments of light-emitting elements which are of the type having a light source including a light-emitting element have been under way. Such a light-emitting device with a light-emitting element is noteworthy for its feature as to power consumption or product lifetime. For example, in the field of residential luminaire technology, the light-emitting device with a light-emitting element is required to possess the capability of emitting light portions of a plurality of color temperatures in a selective manner.

By way of example, there is a light-emitting device designed so that light emitted from a light-emitting element undergoes reflection before being produced outwards (refer to Japanese Unexamined Patent Publication JP-A 2007-201171, for example). There has been a growing demand for a light-emitting device capable of production of light with a higher degree of luminous efficiency.

DISCLOSURE OF INVENTION

A light-emitting device in accordance with one embodiment of the invention includes: a substrate; a pair of electrode layers disposed on the substrate; a light-emitting element disposed between the pair of electrode layers to keep a first space with each of the pair of electrode layers while electrically connecting with each of the pair of electrode layers; and a pair of reflection layers, each extending in overlapping relation from one to the other one of the pair of electrode layers as seen in a transparent plan view. Moreover, in the light-emitting device, the light-emitting element is disposed between the pair of reflection layers to keep a second space with each of the pair of reflection layers.

DESCRIPTION OF EMBODIMENTS

Hereinafter, an embodiment of a light-emitting device pursuant to the invention will be described with reference to the accompanying drawings. It should be noted that the invention is not limited to the embodiment as set forth hereunder.

<Structure of Light-Emitting Device>

A light-emitting device 1 according to the present embodiment includes: a substrate 2; a pair of electrode layers 3 disposed on the substrate 2; a light-emitting element 4 electrically connected to the electrode layers 3; and a pair of reflection layers 5 disposed on the substrate 2. For example, the light-emitting element 4 is a light-emitting diode for emitting excitation light externally by exploiting electron-positive hole reunion in semiconductor-based p-n junction.

The substrate 2 includes a mounting region R1 for the mounting of the light-emitting element 4. The substrate 2 is constructed of an insulating substrate made for example of a sintered body or porous material based on aluminum oxide, titanium oxide, zirconium oxide, or yttrium oxide. In the case where the substrate 2 is made of a porous material, a large number of fine pores are formed in a surface of the substrate 2. Excitation light emitted from the light-emitting element 4 is shone on the surface of the substrate 2 while undergoing diffuse reflection. Thus, the excitation light emitted from the light-emitting element 4 is diffusely reflected for radiation in many directions. This makes it possible to suppress convergence of the excitation light emitted from the light-emitting element 4 to a specific location.

Moreover, the substrate 2 can be made of a ceramic material such for example as alumina, mullite, or glass ceramics, or a composite material based on a mixture of two or more of those materials. Also, polymeric resin containing metal oxide fine particles in a dispersed state can be used for the substrate 2. Note that the thermal conductivity of the substrate 2 is set in a range of 1 [W/m·K] or more and 250 [W/m·K] or less, for example.

Figure 3:
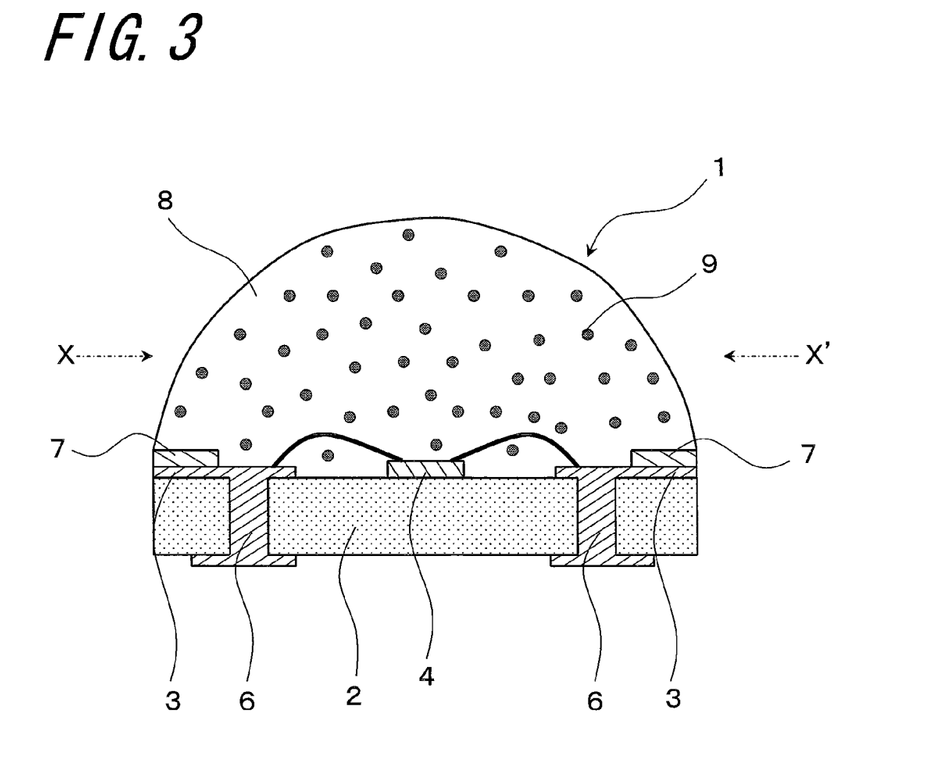
FIG. 3 is a sectional view of the light-emitting device taken along the line X-X' shown in FIG. 2.

Further, as shown in FIG. 3, the substrate 2 is provided with through conductors 6 for electrically connecting between an upper surface and a lower surface thereof. The through conductor 6 is made of an electrically conductive material such for example as tungsten, molybdenum, manganese, or copper. For example, the through conductor 6 can be obtained by printing a metal paste prepared by adding an organic solvent to powder of tungsten or the like, in a predetermined pattern, onto the upper surface of the substrate 2 provided with a through hole. Note that the surface of the through conductor 6 exposed internally and externally of the substrate 2 is clad with a plating layer made of nickel, gold, or the like for protection against oxidation.

Moreover, the through conductor 6 is partly extended to the upper and lower surfaces of the substrate 2. Part of the through conductor 6 which lies on the upper surface of the substrate 2 serves as each of the pair of electrode layers 3.

The electrode layer 3 is formed on the upper surface of the substrate 2. The substrate 2 includes end regions R2 for the formation of the electrode layers 3. The electrode layers 3 are formed on their respective end regions R2 of the substrate 2, with the mounting region R1 situated between them. The electrode layer 3 is made of an electrically conductive material such for example as tungsten, molybdenum, manganese, or copper. Note that the thermal conductivity of the electrode layer 3 is set in a range of 100 [W/m·K] or more and 400 [W/m·K] or less, for example.

Each of the electrode layers 3 includes an extended portion 3*a* extending toward the light-emitting element 3. The electrode layers 3 are disposed to keep a first space with the mounting region R1. As will hereafter be described, the light-emitting element 4 mounted in the mounting region R1 is electrically connected to the extended portion 3*a* via a bonding wire. Although the light-emitting element 4 liberates heat at the time of its light emission action, by forming the extended portion 3*a* which exhibits good thermal conductivity close to the mounting region R1, it is possible to suppress concentration of the heat on a certain part of the substrate 2 while achieving heat diffusion, and thereby suppress occurrence of crack in the substrate 2 effectively.

On the electrode layer 3 is formed a bonding layer 7 which is shaped which part of the extended portion 3*a* is exposed. Part of the end of the electrode layer 3 is covered with the bonding layer 7. The bonding layer 7 extends from the upper surface of the electrode layer 3 to the side surface thereof and from there to the upper surface of the substrate 2. The bonding layer 7 has the function of suppressing separation of the electrode layer 3. Since the end of the electrode layer 3 is covered by the bonding layer 7, it is possible to suppress separation of the end of the electrode layer 3 from the substrate 2. Note that the bonding layer 7 has the function of improving adhesion between the electrode layer 3 and the reflection layer 5. For example, the bonding layer 7 is made of glass based on a transparent inorganic material, or a transparent organic material such as epoxy resin, acrylic resin, or silicone resin.

Moreover, the bonding layer 7 may be made to contain inorganic particles of aluminum oxide, titanium oxide, yttrium oxide, zirconium oxide, or the like, or may be made to bear a plurality of air bubbles. In the case where inorganic particles or air bubbles are contained in the bonding layer 7, light emitted from the light-emitting element 4, or light emitted from fluorescent substances of a wavelength converter 8, is reflected from the inorganic particles or air bubbles contained in the bonding layer 7. The reflected light can be utilized for light radiation from the light-emitting device 1. In particular, the light emitted from the light-emitting element 4 is reflected from the inorganic particles or air bubbles contained in the bonding layer 7 and is thus less likely to be absorbed by the electrode layer 3. This makes it possible to increase the quantity of light subjected to wavelength conversion in the wavelength converter 8, and thereby achieve significant improvement in the light output capability of the light-emitting device 1.

The bonding layer 7 is provided with a cutout 7*a* from which part of the upper surface of the extended portion 3*a* is exposed. The light-emitting element 4 is electrically connected to the extended portion 3*a*, which is part of the electrode layer 3 exposed from the cutout 7*a*, via a bonding wire (not designated by a symbol). That is, the cutout 7*a* is provided at part of the bonding layer 7 located around the extended portion 3*a* to which is connected the bonding wire, so that the extended portion 3*a* can be exposed in part. In this way, part of the light emitted from the light-emitting element 4 or the wavelength converter 8 is reflected in the opposite direction to the substrate 2 by the extended portion 3*a* exposed from the cutout 7*a*, and is thus less likely to enter the bonding layer 7 around the extended portion 3*a* to which is connected the bonding wire. In consequence, it is possible to suppress occurrence of diffuse reflection within the bonding layer 7 resulting from confinement of light in the bonding layer 7, or occurrence of optical losses ascribable to the reflectivity of each constituent component, and thereby enhance the light emitted from the light-emitting element 4 subjected to wavelength conversion in the wavelength converter 8. The light emitted from the light-emitting element 4 is diffusely reflected from the extended portion 3*a* exposed from the cutout 7*a* provided around the junction with the bonding wire.

Moreover, the light that has undergone diffuse reflection around the junction with the bonding wire is applied to the bonding wire from all possible directions around the bonding wire. If there is not provided the cutout 7*a* from which part of the upper surface of the extended portion 3*a* is exposed, at the time of radiation of the light emitted from the light-emitting element 4 out of the light-emitting device 1, a shade could be seen on the resultant irradiated area due to light absorption by the bonding wire. That is, brightness varies over different parts of the irradiated area thereby creating bright and dark spots, which results in unevenness in radiation. However, by providing the cutout 7*a* from which part of the upper surface of the extended portion 3*a* is exposed, it is possible to suppress occurrence of unevenness in radiation, namely lack of uniformity in radiation intensity throughout the irradiated area. More specifically, the light emitted from the light-emitting element 4 or the light emitted from the fluorescent substances of the wavelength converter 8 is diffusely reflected from the extended portion 3*a* exposed from the cutout 7*a*; wherefore the bonding wire can be irradiated with the diffusely-reflected light from all possible directions. Accordingly, the shade of the bonding wire grows lighter, and even illumination on the irradiated area can be achieved.

Especially in the case where the light emitted from the light-emitting element 4 is shorter in wavelength than blue-color light and the bonding wire is made of gold, since gold has the property of incurring a sharp decline in reflectivity for light which is shorter in wavelength than blue-color light, it follows that heavy optical losses are caused by the bonding wire. Therefore, in the driving operation of the light-emitting device 1, lack of uniformity in radiation intensity in the irradiated area, more specifically, uneven illumination due to the shade of the bonding wire, appears appreciably. In this regard, the light-emitting device 1 pursuant to the invention is capable of lessening unevenness in radiation intensity in the irradiated area particularly in the case where the light emitted from the light-emitting element 4 is shorter in wavelength than light including blue-color light and the bonding wire is made of gold, and thus succeeds in even illumination on the irradiated area.

Part of the bonding layer 7 is interposed between the electrode layer 3 and the reflection layer 5. By virtue of the interposition of the bonding layer 7 between the electrode layer 3 and the reflection layer 5, adhesion between the electrode layer 3 and the reflection layer 5 can be maintained satisfactorily. Moreover, when the construction is seen in a transparent plan view, the bonding layer 7 is disposed on the end region R2 of the substrate 2 and reaches a region directly below each of the confronting side surfaces of the pair of reflection layers 5. In the pair of reflection layers 5, the edges of their confronting side surfaces are susceptible to application of external stress and thus to separation. With this in view, by interposing the bonding layer 7 between the reflection layers 5, separation of the reflection layers 5 can be suppressed.

Moreover, the bonding layer 7 is disposed on the end region R2 of the substrate 2 and extends from each of the confronting side surfaces of the pair of reflection layers 5 to the underside of the reflection layer 5, as seen in a transparent plan view. In the bonding layer 7, intermolecular bonds of the material constituting the bonding layer 7 could be broken by short-wavelength light such as ultraviolet light, thus causing deterioration in the adherability or mechanical strength of the bonding layer 7. Therefore, in the case where the bonding layer 7 is partly covered by the reflection layer 5, the light emitted from the light-emitting element 4 or the light emitted from fluorescent substances 9 is reflected from the surface of the reflection layer 5, and is thus less likely to travel into the bonding layer 7. Further, even if a large quantity of short-wavelength light is applied to the bonding layer 7 and consequently the bonding layer 7 suffers from progression of quality degradation, since the bonding layer 7 is covered at its end with the reflection layer 5, it is possible to suppress separation of the bonding layer 7 from the substrate 2. In consequence, the light-emitting device 1 can be operated properly for long periods of time.

The light-emitting element 4 is mounted in the mounting region R1 of the substrate 2 via resin, for example. The light-emitting element 4 includes a mounting substrate and an optical semiconductor layer formed on the mounting substrate. The mounting substrate is of the type that allows the growth of the optical semiconductor layer by means of chemical vapor deposition such as a metalorganic chemical vapor deposition or molecular beam epitaxy. Examples of the material of construction of the mounting substrate include sapphire, gallium nitride, aluminum nitride, zinc oxide, silicon carbide, silicon, and zirconium diboride. The thickness of the mounting substrate falls in a range of 100 µm or more and 1000 µm or less.

The optical semiconductor layer is composed of a first semiconductor layer formed on the mounting substrate, a light-emitting layer formed on the first semiconductor layer, and a second semiconductor layer formed on the light-emitting layer.

For example, Group-III nitride semiconductors, Group III-V semiconductors such as gallium phosphide or gallium arsenide, or Group III nitride semiconductors such as gallium nitride, aluminum nitride, or indium nitride can be used for the first semiconductor layer, the light-emitting layer, and the second semiconductor layer. The thickness of the first semiconductor layer falls in a range of 1 µm or more and 5 µm or less, for example. The thickness of the light-emitting layer falls in a range of 25 nm or more and 150 nm or less, for example. The thickness of the second semiconductor layer falls in a range of 50 nm or more and 600 nm or less, for example. Moreover, as the light-emitting element 4 thusly constructed, for example, an element capable of giving forth excitation light having a wavelength of 370 nm or more and 420 nm or less can be employed.

The reflection layers 5 are so arranged that the light-emitting element 4 is disposed between the reflection layers 5 to keep a second space with each of the reflection layers 5. The reflection layer 5 has the function of reflecting excitation light emitted from the light-emitting element 4 or the function of reflecting light emitted from the fluorescent substances contained in the wavelength converter 8. For example, the reflection layer 5 can be formed of transparent resin such as epoxy resin, acrylic resin, or silicone resin, or transparent glass containing metal oxide particles made of aluminum oxide, titanium oxide, yttrium oxide, zirconium oxide, or the like. The thermal conductivity of the reflection layer 5 is set in a range of 1 [W/m·K] or more and 12 [W/m·K] or less, for example. The thickness of the reflection layer 5 is set in a range of 0.1 mm or more and 1 mm or less, for example, so that the reflection layer 5 is thicker than the light-emitting element 4. More specifically, the thickness of the reflection layer 5 is larger than the thickness of the light-emitting element 4 by an amount of greater than or equal to 0.1 mm but less than or equal to 0.9 mm.

Thus, the reflection layer 5 is made larger in thickness than the light-emitting element 4, and is disposed so as to be opposite to each of the pair of side surfaces of the light-emitting element 4. In this way, the excitation light emitted from the light-emitting element 4 is reflected from the reflection layer 5 and travels toward the wavelength converter 8 which will hereafter be described.

Since the thickness of the reflection layer 5 is greater than that of the light-emitting element 4, it is possible to achieve effective diffuse reflection of excitation light traveling obliquely upwardly from the light-emitting element 4, and thereby suppress convergence of the light emitted from the light-emitting element 4 to a specific location.

Moreover, when the construction is seen in a transparent plan view, the reflection layers 5 are so arranged that a pair of confronting side surfaces thereof extend along the bonding wire for electrically connecting between the pair of electrode layers 3 and the light-emitting element 4. Part of the fluorescent substances 9 lying in a location overlapping the bonding wire as seen in a transparent plan view is less likely to receive sufficient radiation of the light emitted from the light-emitting element 4. Therefore, by arranging the reflection layers 5 so that the pair of confronting side surfaces extend along the bonding wire as seen in a transparent plan view, the light emitted from the light-emitting element 4 can be diffusely reflected from the side surfaces of the reflection layers 5, whereby the bonding wire can be irradiated with the light. Since the bonding wire is irradiated with the light emitted from the light-emitting element 4 from all possible directions through the side surfaces of the reflection layers 5, it follows that the light emitted from the light-emitting element 4 is applied to part of the fluorescent substances 9 located on a straight line connecting the light-emitting element 4 with the bonding wire. This makes it possible to increase the number of the fluorescent substances 9 to be excited by the light emitted from light-emitting element 4, and thereby improve the light output capability of the light-emitting device 1.

By contrast, in the case where the reflection layers 5 are not so arranged that the pair of confronting side surfaces extend along the bonding wire for electrically connecting between the pair of electrode layers 3 and the light-emitting element 4 as seen in a transparent plan view, it never occurs that the light beams emitted from the light-emitting element 4, after being diffusely reflected from the side surfaces of the reflection layers 5, are applied to a pair of bonding wires in a symmetrical manner about the light-emitting element 4. After all, part of the fluorescent substances 9 located on the straight line connecting the light-emitting element 4 with the bonding wire is less likely to be irradiated with the light in a symmetrical manner about the light-emitting element 4. This leads to lack of uniformity in the amount of the fluorescent substances to be excited by the light emitted from the light-emitting element 4, and thus to uneven illuminance distribution on the irradiated area of the light-emitting device 1, in consequence whereof there may result unevenness in color.

When the construction is seen in a transparent plan view, the reflection layer 5 extends in overlapping relation from one of the pair of electrode layers 3 to the other one of them. Part of the heat liberated by the light-emitting element 4 at the time of its light emission action is transmitted, through the electrode layer 3, to the reflection layer 5. By shaping the reflection layer 5 into a broad strip-like layer extending from one end to the other end of the substrate 2, each of which is provided with the electrode layer 3, it is possible to facilitate transmission of the heat liberated by the light-emitting element 4 through the entire surface of the substrate 2, as well as to suppress concentration of the heat on a certain part of the substrate 2. Accordingly, occurrence of crack in the substrate 2 can be suppressed effectively.

Moreover, the reflection layer 5 extends in overlapping relation from one of the pair of electrode layers 3 to the other one of them. Therefore, in the acquisition of temperature by each of the pair of electrode layers 3, the electrode layers 3 become able to share common temperatures via the reflection layer 5; wherefore the difference in temperature between the pair of electrode layers 3 can be minimized. In consequence, variations in temperature distribution on the upper surface of the substrate 2 can be suppressed. This makes it possible to reduce the possibility of delamination on the substrate 2 resulting from thermal stress, as well as to suppress occurrence of crack in the substrate 2.

The wavelength converter 8 is disposed on the substrate 2 and covers the reflection layer 5 and the light-emitting element 4. The wavelength converter 8 has the function of, in response to emission of excitation light from the light-emitting element 4, giving forth visible light which is longer in wavelength than the excitation light. Note that the wavelength converter 8 is made for example of silicone resin, acrylic resin, or epoxy resin. The resin constituting the wavelength converter 8 contains the fluorescent substances 9, including a blue phosphor for giving forth fluorescence having a wavelength of 430 nm or more and 490 nm or less for example, a green phosphor for giving forth fluorescence having a wavelength of 500 nm or more and 560 nm or less for example, a yellow phosphor for giving forth fluorescence having a wavelength of 540 nm or more and 600 nm or less for example, and a red phosphor for giving forth fluorescence having a wavelength of 590 nm or more and 700 nm or less for example. Note that the fluorescent substances 9 are uniformly dispersed in the wavelength converter 8.

Figure 4:
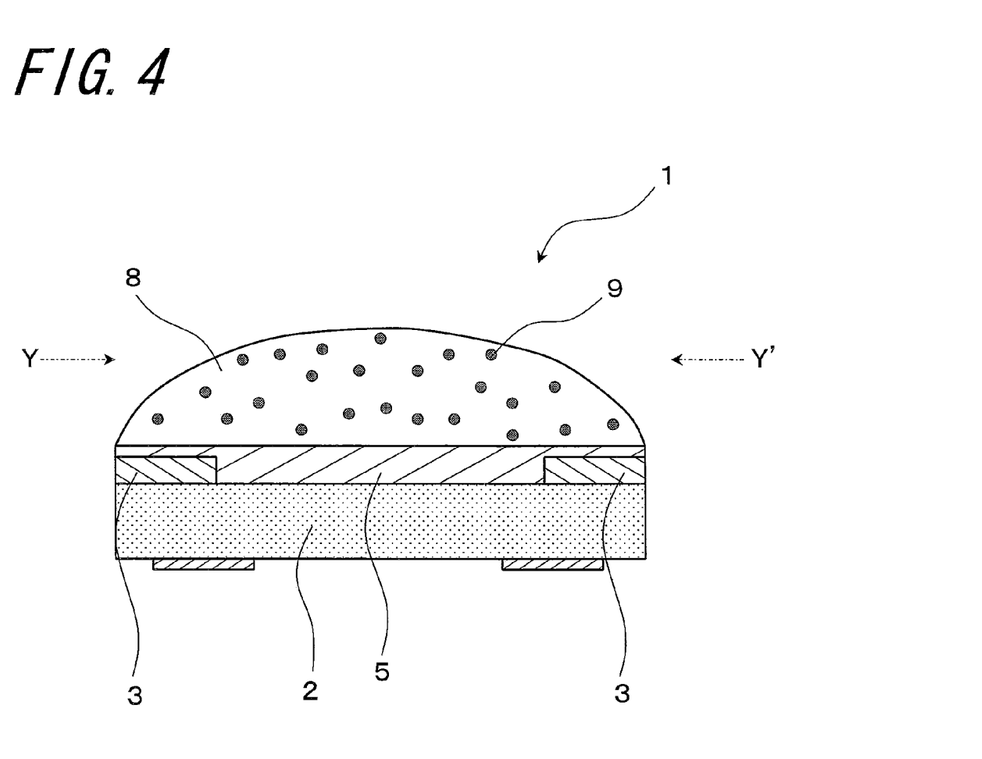
FIG. 4 is a sectional view of the light-emitting device taken along the line Y-Y' shown in FIG. 2.

Moreover, in the design of the wavelength converter 8, drops of the material for forming the wavelength converter 8 are put on the upper surface of the substrate 2 by potting, for example. In this way, the dome-shaped wavelength converter 8 is formed on the substrate 2. As shown in FIG. 3 or FIG. 4, the thickness of the wavelength converter 8 is set in a range of 0.3 mm or more and 10 mm or less, for example, and is set so that a part of the wavelength converter 8 located immediately above the light-emitting element 4 has the largest thickness. By designing the wavelength converter 8 in a dome-like shape, it is possible to render uniform the amount of light excited by the excitation light emitted from the light-emitting element 4, and thereby suppress unevenness in luminance in the wavelength converter 8.

Further, a gap between the pair of reflection layers 5 is filled with part of the wavelength converter 8. Since part of the wavelength converter 8 finds its way into the gap between the pair of reflection layers 5 and is whereafter solidified, it is possible to improve adhesion between the wavelength converter 8 and the substrate 2.

According to the embodiment, the excitation light emitted from the light-emitting element 4 is reflected from the reflection layer 5 and is applied to the wavelength converter 5 as a whole. This makes it possible to increase the wavelength conversion efficiency of the wavelength converter 5, and thus increase the luminous efficiency of the light-emitting device 1.

Moreover, since the wavelength converter 5 can be entirely irradiated with excitation light, it is possible to render the amount of excitation of the fluorescent substances within the wavelength converter 5 substantially uniform throughout the entire surface of the wavelength converter 5 as seen in a plan view. In consequence, the uniformity of light acquired from the wavelength converter 5 can be improved.

Further, light reflected in a direction toward the substrate 2 by the fluorescent substances 9 contained in the wavelength converter 8, after being diffusely reflected from the reflection layer 5, is applied to the fluorescent substances 9 once again. In consequence, the number of the fluorescent substances 9 excited by the light emitted from the light-emitting element 4 is increased, and also the quantity of light emitted from the fluorescent substances 9 is increased. This leads to the improvement of the light output capability of the light-emitting device 1.

MODIFIED EXAMPLES

It should be understood that the application of the invention is not limited to the specific embodiment described heretofore, and that various changes and modifications are possible without departing from the gist of the invention. Hereinafter, examples of modified form of the above-stated embodiment will be described. In the following light-emitting device implemented by way of modified example of the above-stated embodiment, the constituent components similar to those of the light-emitting device 1 of the above-stated embodiment will be identified with like reference symbols, and the descriptions thereof will be omitted.

Modified Example 1

While, in the above-stated embodiment, the bonding layer 7 is shaped so that only part of the extended portion 3a of the electrode layer 3 is exposed, it does not constitute any limitation. For example, as shown in FIG. 9, it is possible to form a bonding layer 7x which covers much of the electrode layer 3-free area of the upper surface of the substrate 2.

Figure 9:
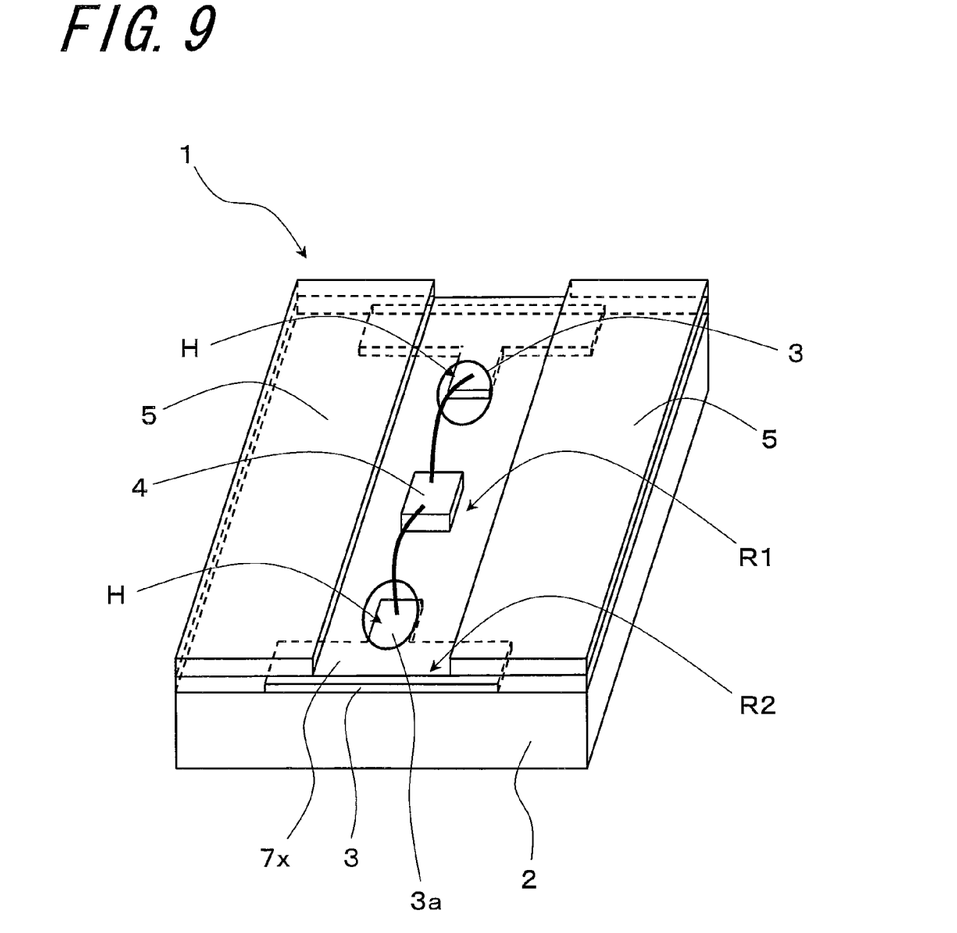
FIG. 9 is a perspective view showing an overview of a light-emitting device according to one modified example.

In this case, as shown in FIG. 9, on the substrate 2 is disposed the bonding layer 7x having a pair of through holes H so that part of the bonding layer 7x located immediately above the extended portion 3a of the electrode layer 3 is exposed. Thus, the mounting region R1 of the substrate 2 is covered with the bonding layer 7x. The light-emitting element 4 is connectedly placed on the bonding layer 7x attached to the mounting region R1 by using an adhesive material containing highly heat-conductive inorganic particles such for example as aluminum oxide, titanium oxide, yttrium oxide, or zirconium oxide. Moreover, the extended portion 3a, which is part of the electrode layer 3, is exposed from the through hole H. The light-emitting element 4 is electrically connected to the extended portion 3a via a bonding wire.

Since the bonding layer 7x is formed over the substrate 2 and the electrode layer 3 excluding part of the extended portion 3a, it is possible to improve adhesion between the substrate 2 and the reflection layer 5. Moreover, inorganic particles are contained in the bonding layer 7; wherefore the light emitted from the light-emitting element 4 is reflected in an upward direction by the bonding layer 7. This leads to significant improvement in the light output capability of the light-emitting device 1.

Modified Example 2

While, in the above-stated embodiment, the substrate 2 has the form of a rectangular parallelepiped, it does not constitute any limitation. For example, as shown in FIG. 10 or FIG. 11, it is possible to provide a substrate 2x having a notch 2a formed at part of its upper surface.

Figure 10:
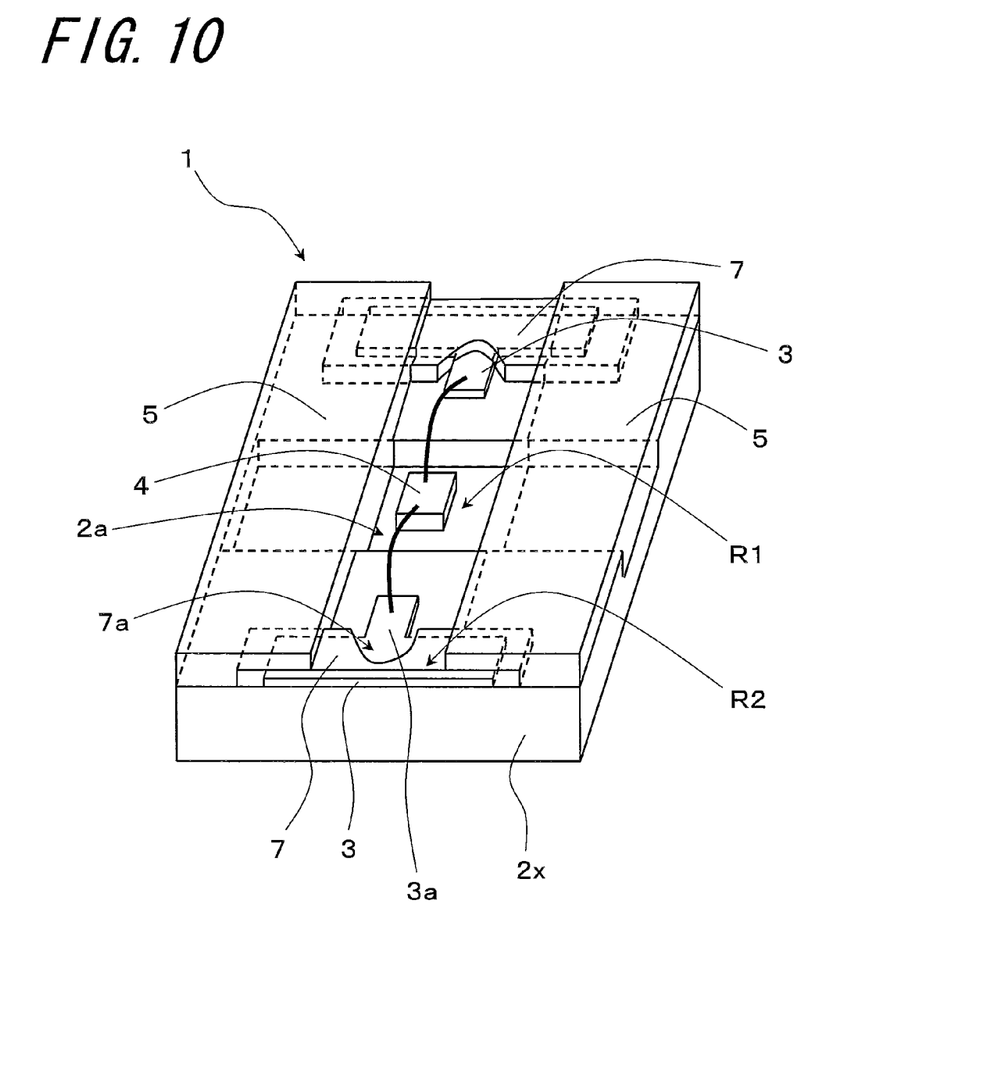
FIG. 10 is a perspective view showing an overview of a light-emitting device according to one modified example.
Figure 11:
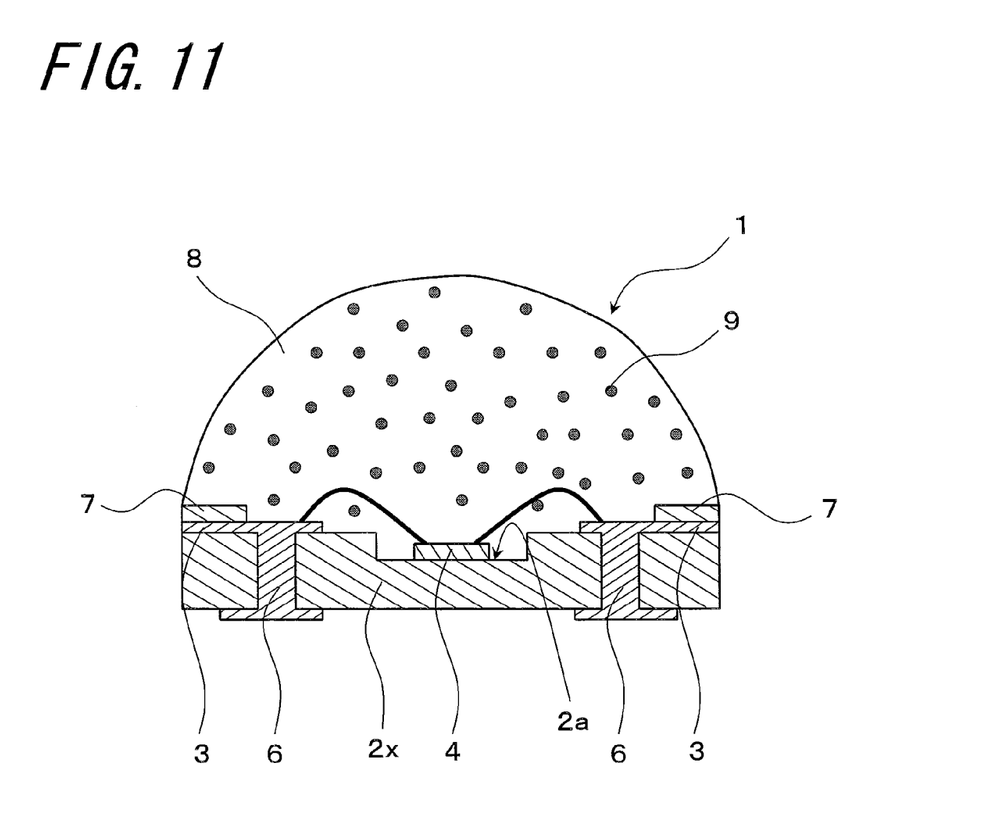
FIG. 11 is a sectional view of the light-emitting device shown in FIG. 10, which corresponds to the sectional view of FIG. 3.

As shown in FIG. 10, the substrate 2x can be used in which the notch 2a is formed by cutting part of the upper surface thereof situated between the pair of electrode layers 3 in a planar direction. The light-emitting element 4 is connected in the notch 2a of the substrate 2x via an adhesive material or silver paste containing highly heat-conductive inorganic particles such for example as aluminum oxide, titanium oxide, yttrium oxide, or zirconium oxide.

In this example, the level of the upper surface of the substrate 2x provided with the electrode layer 3 differs from the level of the upper surface of the notch 2a of the substrate 2x where the light-emitting element 4 is mounted. The upper surface of the notch 2a of the substrate 2x where the light-emitting element 4 is mounted is set to be lower in level than the upper surface of the substrate 2x provided with the electrode layer 3.

The light-emitting element 4 is connected to the upper surface of the notch 2a of the substrate 2x via an adhesive material such for example as an electrically conductive silver paste containing metal particles. If the substrate 2x is devoid of the notch 2a, the electrically conductive adhesive material could spread out to eventually adhere to the extended portions 3a of the pair of electrode layers 3. Upon connecting between the extended portions 3a of the pair of electrode layers 3 through the electrically conductive adhesive material, electrical short-circuiting could happen in the extended portions 3a of the pair of electrode layers 3, with the result that the light-emitting device 1 becomes incapable of normal operation. With this in view, by forming the notch 2a at the location for the mounting of the light-emitting element 4, it is possible to protect the extended portions 3a of the pair of electrode layers 3 against electrical short-circuiting effectively.

<Method of Manufacturing Light-Emitting Device>

Figure 1:
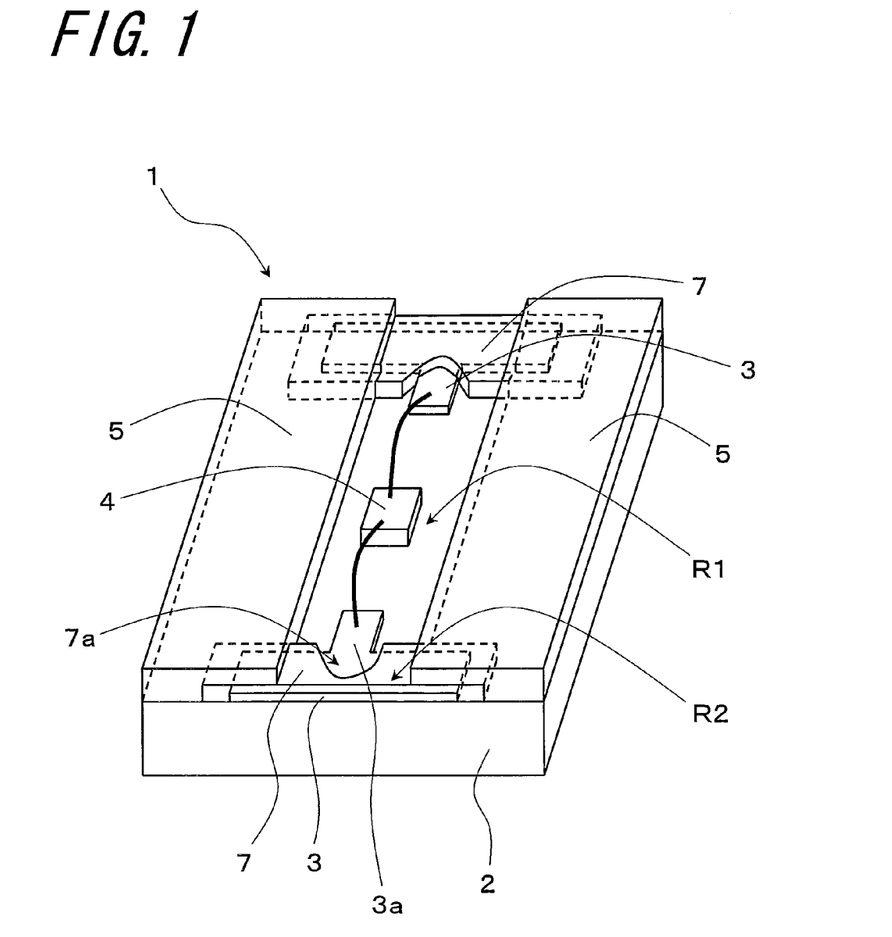
FIG. 1 is a perspective view showing an overview of a light-emitting device according to an embodiment.
Figure 2:
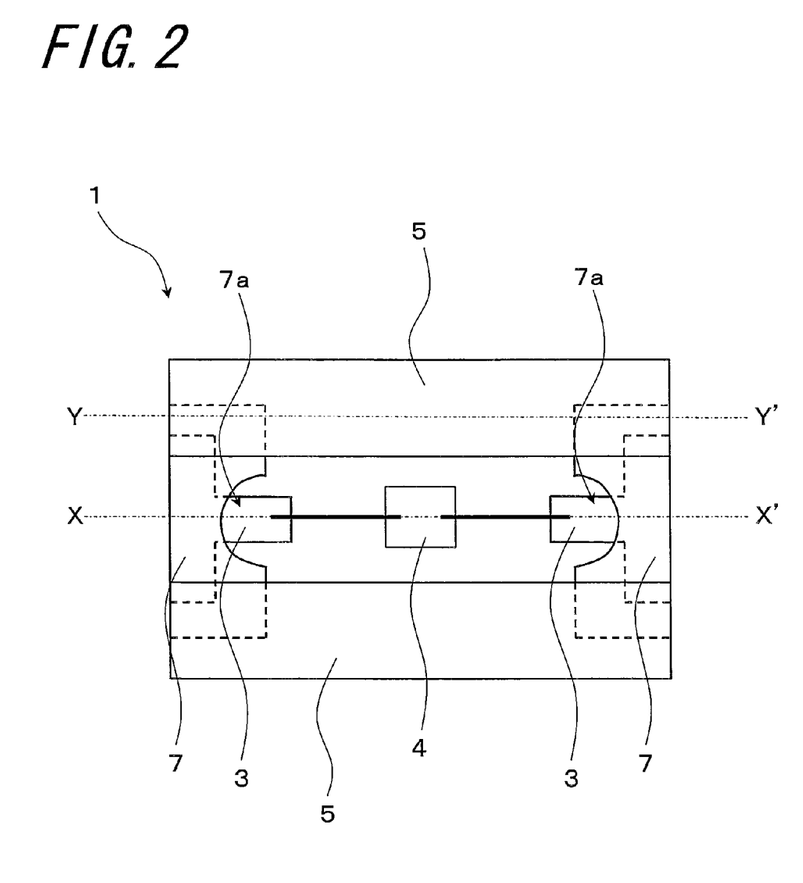
FIG. 2 is a plan view of the light-emitting device according to the embodiment.

Now, a description will be given below as to a method for manufacturing the light-emitting device as shown in FIG. 1 or FIG. 2. Note that FIGS. 5 to 8 are plan views for explaining the method of manufacturing the light-emitting device.

To begin with, the substrate 2 is prepared. For example, in the case of forming the substrate 2 from sintered aluminum oxide, an organic binder, a plasticizer or a solvent, and so forth are admixed in raw material powder of aluminum oxide to obtain a mixture. The mixture is charged into a mold form for the substrate 2. Following the completion of drying process, the substrate 2 in a yet-to-be-sintered state is taken out.

Figure 5:
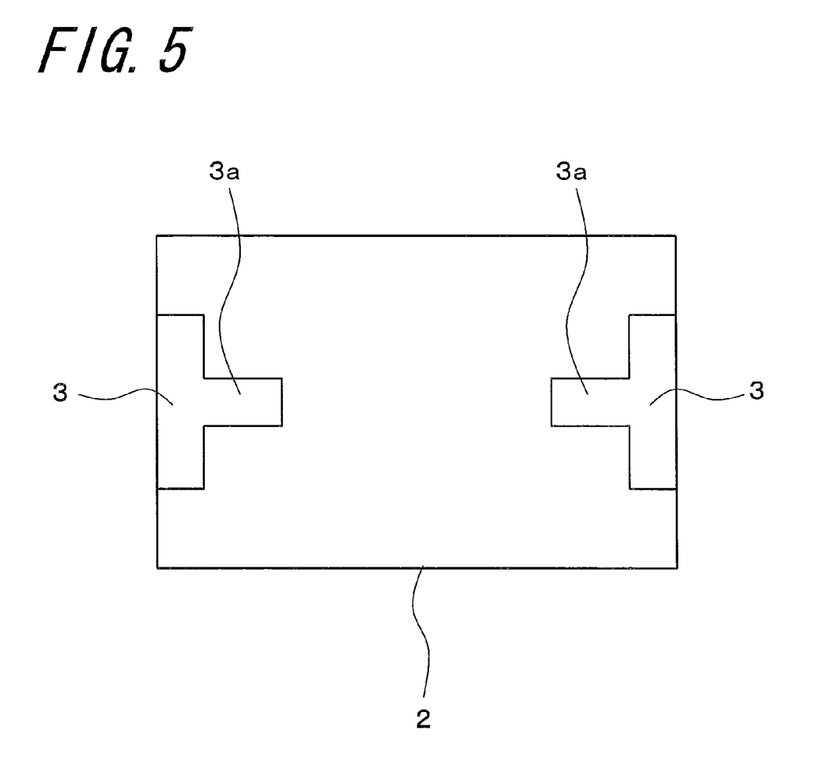
FIG. 5 is a plan view for explaining a method for manufacturing the light-emitting device according to the embodiment.

Subsequently, through holes are formed in the unsintered substrate 2. Moreover, powder of high-melting-point metal such as tungsten, molybdenum, or the like is prepared, and an organic binder, a plasticizer or a solvent, and so forth are admixed in the powder to obtain a metal paste. Then, a pattern for forming the pair of electrode layers 3 is printed on the substrate 2 provided with the through holes by means of a printing method for example, and the through holes are filled with the through conductors 6. At this time, the patterning of the electrode layer 3 is performed in a manner that creates the extended portion 3a on the end region R2 of the substrate 2. Then, as shown in FIG. 5, the unsintered substrate 2 provided with the electrode layers 3 is fired.

Figure 6:
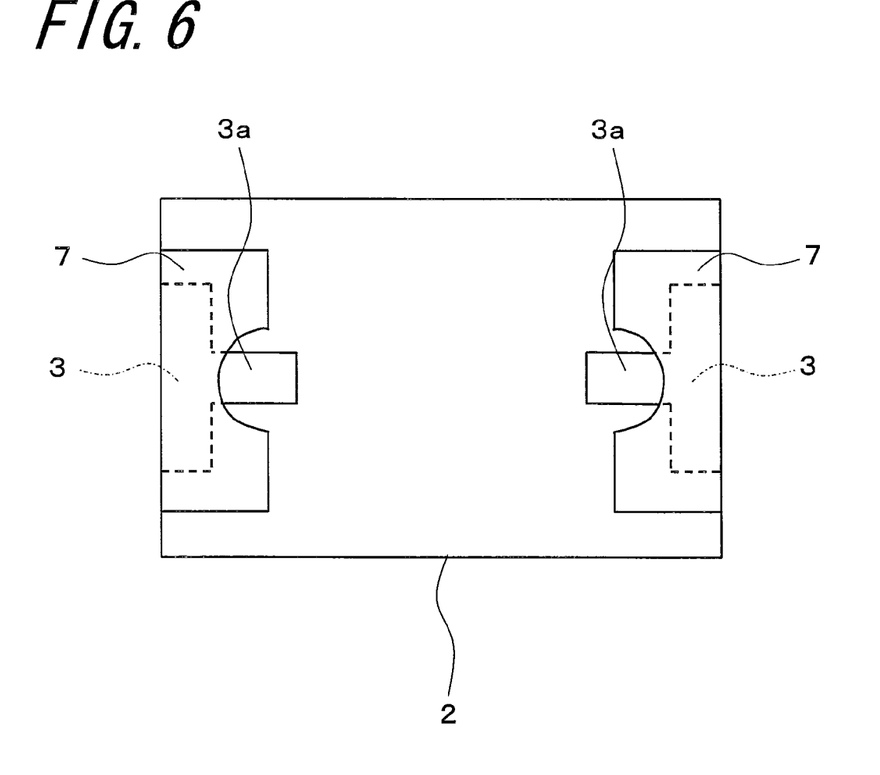
FIG. 6 is a plan view for explaining a method for manufacturing the light-emitting device according to the embodiment.

Next, as shown in FIG. 6, the bonding layer 7 made of transparent glass is formed on each of the pair of electrode layers 3, with the extended portion 3a of the electrode layer 3 left exposed, by means of a screen printing method and a sol-gel method, for example. The bonding layer 7 covers the electrode layer 3 excluding the extended portion 3a. In order to remove air bubbles generated within the bonding layer 7 in the course of sol-gel process, it is advisable to heat the fired substrate 2 up to about 1000° C. for the removal of air bubbles. Alternatively, the bonding layer 7 may be formed by a method including a step of applying a glass-containing binder to predetermined locations by means of a printing method and a step of performing firing at about 1000° C.

Figure 7:
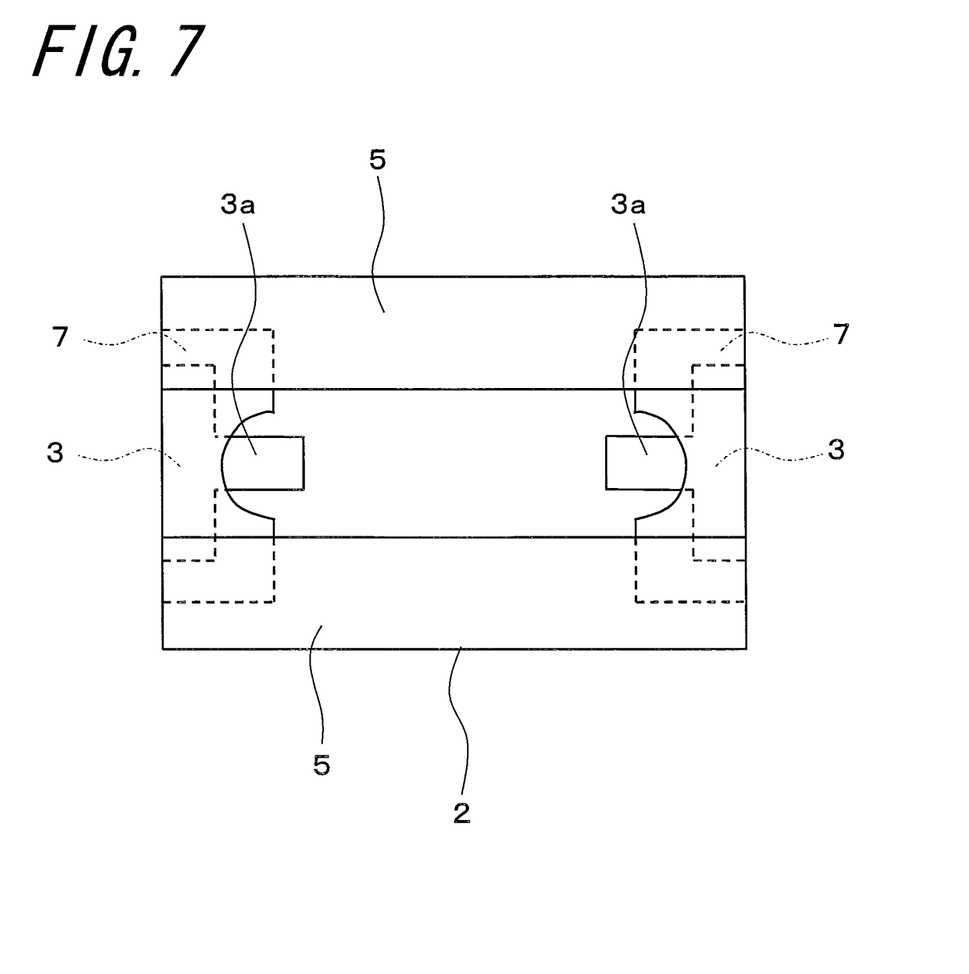
FIG. 7 is a plan view for explaining a method for manufacturing the light-emitting device according to the embodiment.

Next, the pair of reflection layers 5 made of epoxy resin containing aluminum oxide particles are formed by means of a screen printing method, for example. As shown in FIG. 7, when the construction is seen in a transparent plan view, the reflection layer 5 extends from one of the pair of electrode layers 3 to the other one of them. That is, the reflection layer 5 extends from one of the pair of bonding layers 7 to the other one of them. At this time, the mounting region R1 of the substrate 2 is free of the reflection layer 5.

Figure 8:
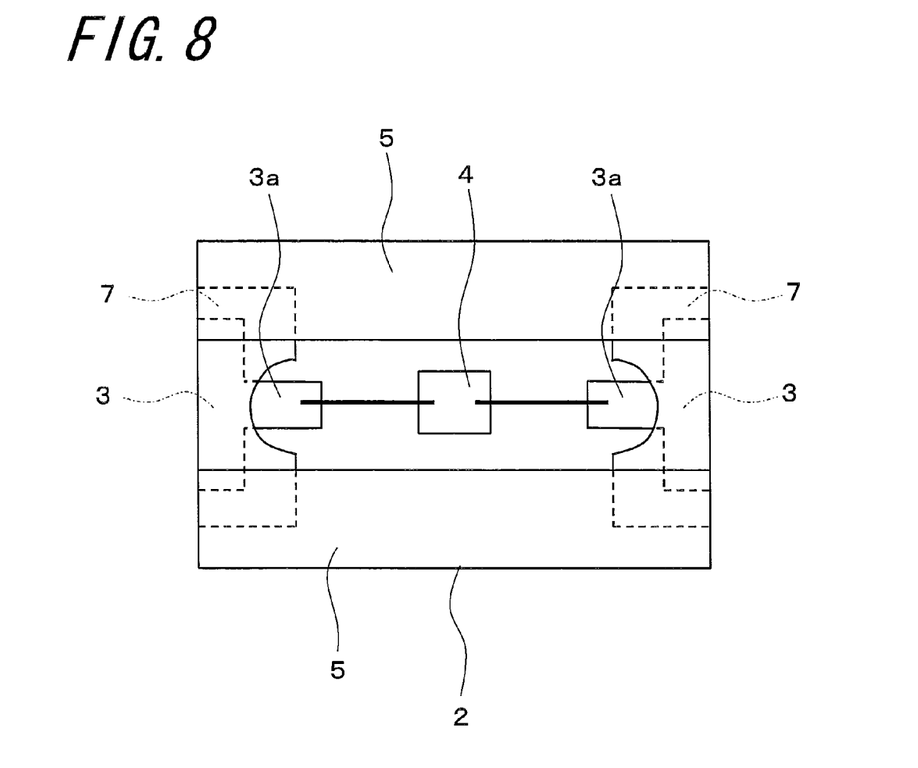
FIG. 8 is a plan view for explaining a method for manufacturing the light-emitting device according to the embodiment.

Next, as shown in FIG. 8, the light-emitting element 4 is mounted on the mounting region R1, which is a region on the substrate 2 sandwiched between the pair of reflection layers 5, via a silver paste, for example. Then, the light-emitting element 4 is electrically connected to the extended portion 3a of the electrode layer 3 via a bonding wire made for example of gold.

Next, the wavelength converter 8 is prepared. Uncured resin mixed with the fluorescent substances 9 is used for the wavelength converter 8. The material for forming the wavelength converter 8 are dropped from above downward onto the light-emitting element 4 placed on the substrate 2 as seen in a plan view by potting, for example, so that the material can be shaped into a dome-like form. The dome-shaped material is cured through the application of heat, whereupon the formation of the wavelength converter 8 is completed. In this way, the light-emitting device 1 can be manufactured.

The invention claimed is:

1. A light-emitting device, comprising:
   a substrate;
   a pair of electrode layers disposed on the substrate;
   a light-emitting element disposed between the pair of electrode layers to keep a first space with each of the pair of electrode layers while electrically connecting with each of the pair of electrode layers; and
   a pair of reflection layers, each extending in overlapping relation from one to the other one of the pair of electrode layers as seen in a transparent plan view, and
   wherein the light-emitting element is disposed between the pair of reflection layers to keep a second space with each of the pair of reflection layers,
   wherein each of the pair of electrode layers comprises an extended portion extending toward the light-emitting element, and the light-emitting element is electrically connected to the extended portion via a bonding wire,
   a bonding layer formed on each of the pair of electrode layers, the bonding layer being shaped such that a part of the extended portion is exposed, and covering part of an end of the respective electrode layers.

2. The light-emitting device according to claim 1, wherein the bonding layer is provided with a cutout from which part of the extended portion is exposed.

3. The light-emitting device according to claim 1, wherein the bonding layer is interposed between the electrode layer and the reflection layer.

4. The light-emitting device according to claim 1, further comprising:
   a wavelength converter disposed on the substrate and covering the pair of reflection layers and the light-emitting element.

* * * * *